(12) United States Patent
Masuda et al.

(10) Patent No.: US 8,105,763 B2
(45) Date of Patent: Jan. 31, 2012

(54) METHOD OF FORMING PLATED PRODUCT USING NEGATIVE PHOTORESIST COMPOSITION AND PHOTOSENSITIVE COMPOSITION USED THEREIN

(75) Inventors: Yasuo Masuda, Kawasaki (JP); Yasushi Washio, Kawasaki (JP); Koji Saito, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 907 days.

(21) Appl. No.: 11/629,017

(22) PCT Filed: May 10, 2005

(86) PCT No.: PCT/JP2005/008846
§ 371 (c)(1),
(2), (4) Date: Dec. 7, 2006

(87) PCT Pub. No.: WO2006/003757
PCT Pub. Date: Jan. 12, 2006

(65) Prior Publication Data
US 2008/0032242 A1 Feb. 7, 2008

(30) Foreign Application Priority Data
Jun. 30, 2004 (JP) .............................. P2004-195034

(51) Int. Cl.
*G03F 5/00* (2006.01)
(52) U.S. Cl. .................. 430/322; 430/270.1; 430/312; 430/324; 430/330; 205/126; 205/163
(58) Field of Classification Search ............... 430/270.1, 430/312, 322, 324, 330; 205/126, 163
See application file for complete search history.

(56) References Cited

U.S. PATENT DOCUMENTS

| | | | |
|---|---|---|---|
| 4,756,988 A | 7/1988 | Kausch et al. | |
| 5,722,162 A | 3/1998 | Chou et al. | |
| 6,040,117 A * | 3/2000 | Ota et al. | 430/311 |
| 6,042,988 A * | 3/2000 | Sato et al. | 430/270.1 |
| 6,838,229 B2 * | 1/2005 | Washio et al. | 430/324 |
| 2003/0064319 A1 | 4/2003 | Saito et al. | |
| 2003/0113663 A1 | 6/2003 | Kobayashi | |
| 2004/0076743 A1 | 4/2004 | Kukanskis et al. | |
| 2005/0181313 A1* | 8/2005 | Shih et al. | 430/394 |
| 2007/0264598 A1* | 11/2007 | Chang et al. | 430/322 |

FOREIGN PATENT DOCUMENTS

| | | |
|---|---|---|
| DE | 100 58 951 A1 | 6/2002 |
| EP | 0 621 508 A1 | 10/1994 |
| EP | 0 621 509 A1 | 10/1994 |
| EP | 0 715 490 A2 | 6/1996 |
| JP | 01-077127 | 3/1989 |
| JP | 7-106220 * | 4/1995 |
| JP | 08-044070 | 2/1996 |
| JP | 08-045116 | 2/1996 |
| JP | 2000-164457 | 6/2000 |
| JP | 2000-206684 A | 7/2000 |
| JP | 2000-258905 | 9/2000 |
| JP | 2003-029415 | 1/2003 |
| JP | 2003-114531 | 4/2003 |
| JP | 2003-322975 | 11/2003 |

* cited by examiner

*Primary Examiner* — Thorl Chea
(74) *Attorney, Agent, or Firm* — Knobbe Martens Olson & Bear LLP

(57) ABSTRACT

A method is provided that enables the formation of multiple level plated products with large plating depth. A negative photoresist composition comprising (a) an alkali-soluble resin, (b) an acid generator, and (c) other components is used, and a plated product is formed by (A) a step of forming a layer of this negative photoresist composition, and then either heating or not heating, before conducting exposure; (B) a step of repeating the step (A) so that the step is performed a total of 2 or more times, thereby superimposing layers of the negative photoresist, and subsequently developing all of these layers simultaneously to form a multilayer resist pattern; and (C) a step of conducting plating treatment within this multilayer resist pattern.

20 Claims, 1 Drawing Sheet

METHOD OF FORMING PLATED PRODUCT USING NEGATIVE PHOTORESIST COMPOSITION AND PHOTOSENSITIVE COMPOSITION USED THEREIN

RELATED APPLICATIONS

This application is the U.S. National Phase filing under 35 U.S.C. §371 of PCT/JP2005/008846, filed May 10, 2005, which designated the United States and was published in a language other than English, which claims priority under 35 U.S.C. §119(a)-(d) to Japanese Patent Application No. 2004-195034, filed June 30, 2004. The content of these applications is incorporated herein by reference in their entireties.

TECHNICAL FIELD

The present invention relates to a method of forming a multiple level plated product using a negative photoresist composition, and a photosensitive composition used in such a method, and relates more specifically to a method of forming a plated product with a high aspect ratio or a multiple level plated product with a complex shape by conducting plating treatment using a thick-film multilayer resist pattern, as well as a photosensitive composition used in such a method.

BACKGROUND ART

In recent years, amongst methods for forming microscopic structures and microscopic components typified by MEMS (Micro ElectroMechanical Systems), formation methods that use a combination of a thick-film lithography method and a plating method are attracting much attention.

However, with conventional methods, the formation of thick films is problematic, and the fabrication of high-precision three dimensional shapes in which the shape varies through the thickness direction, such as the formation of gears of differing diameter, has proven particularly difficult.

Examples of such formation methods include a method of processing a photoresist disclosed in a patent reference 1, wherein a complex exposure operation using different mask patterns and different exposure doses, and including overlapping exposure regions, is performed on a photoresist layer, and the photoresist layer is then developed, forming stepped concave sections within the photoresist layer.

Furthermore, a patent reference 2 discloses a method of forming an opening within a substrate, comprising a step of forming a first layer of a positive photoresist on the substrate, a step of exposing the first layer with a quantity of photochemically active radiation that is sufficient to partially decompose an activator in the positive photoresist but insufficient to cause dissolution in the developing solution, a step of applying a second layer of a positive photoresist on top of the first layer, a step of performing pattern exposure of the first and second layers with a sufficient quantity of photochemically active radiation to cause dissolution of both the first and second positive photoresists within the developing solution, and a step of developing the first and second layers to form an opening through the first and second layers.

[Patent Reference 1]
Japanese Unexamined Patent Application, First Publication No. 2003-29415
[Patent Reference 2]
Japanese Unexamined Patent Application, First Publication No. Hei 9-199663

DISCLOSURE OF INVENTION

However, in the method of the patent reference 1, because the resist layer was a single layer, and steps were formed in this layer by varying the exposure dose, accurately reproducing a stepped shape required highly precise control of the exposure through the film thickness direction of the resist. In addition, if a thick film was used, then exposure down to the bottom layer was unsatisfactory.

In the patent reference 2, the exposure dose must be set to a level insufficient to cause dissolution within the developing solution, and in a similar manner to the patent reference 1, highly precise control of the exposure dose through the film thickness direction of the resist was required. In addition, and in a similar manner to the patent reference 1, if a thick film was used, then exposure down to the bottom layer tended to become unsatisfactory. Moreover, the method of the patent reference 2 disclosed only a 2-layer resist pattern.

In other methods of forming multilayer resist patterns, where individual layers are exposed and developed, and then another resist pattern is formed on top and subsequently exposed and developed, achieving satisfactory film planarity and resolution has proven difficult. Furthermore, in methods of forming multilayer resist patterns wherein following application of a resist composition, and subsequent heating as required, a further resist composition is applied over the top, the formation of complex shapes has proven impossible.

The present invention takes the conventional circumstances described above into consideration, with an object of providing a method of forming a thick, high-precision plated product using a thick-film multilayer resist pattern, which does not require precise exposure control through the film thickness direction, comprises 2 or more layers, and has been adequately exposed down to the bottom layer, as well as providing a method that enables the formation of complex stepped shapes within a plated product.

As a result of intensive research aimed at achieving the above object, the inventors of the present invention discovered that the problems described above could be resolved by using specific steps using a specific negative photoresist composition, and they were hence able to complete the present invention.

The present invention is based on the above discovery, and a method of forming a plated product according to the present invention comprises (A) a step of forming a layer of a negative photoresist composition, heating and then exposing the composition, and then either heating or not heating, (B) a step of repeating the step (A) so that the step is performed a total of 2 or more times to superimpose layers of the negative photoresist, and then developing all of the layers simultaneously to form a multilayer resist pattern, and (C) a step of conducting plating treatment within the multilayer resist pattern, wherein the negative photoresist composition comprises (a) an alkali-soluble resin, (b) an acid generator, and (c) other components.

The exposure used in the step (A) is preferably capable of pattern formation in all of the resist layers. Furthermore, the exposure surface area of the exposure conducted in the step (A) may be larger for a layer more distant from the exposure light source than for a layer closer to the exposure light source. The heating following resist layer formation in the step (A) can use heat treatment within an oven.

A negative photoresist composition according to the present invention comprises (a) an alkali-soluble resin, (b) an acid generator, and (c) other components. In a composition of the present invention, as the component (a), a novolak resin can be used.

The above step (A) can also employ a step in which a sheet-like negative photoresist composition is used to form the negative photoresist layer, and this layer is then exposed, and heated as required.

According to a method of forming a plated product using a negative photoresist composition according to the present invention, and a photosensitive composition used in such a method, a thick, high-precision plated product can be produced using a thick-film multilayer resist pattern, which does not require precise exposure control through the film thickness direction, comprises 2 or more layers, and has been adequately exposed down to the bottom layer. Furthermore, complex stepped shapes can also be formed within the plated product.

BEST MODE FOR CARRYING OUT THE INVENTION

Figure 1:
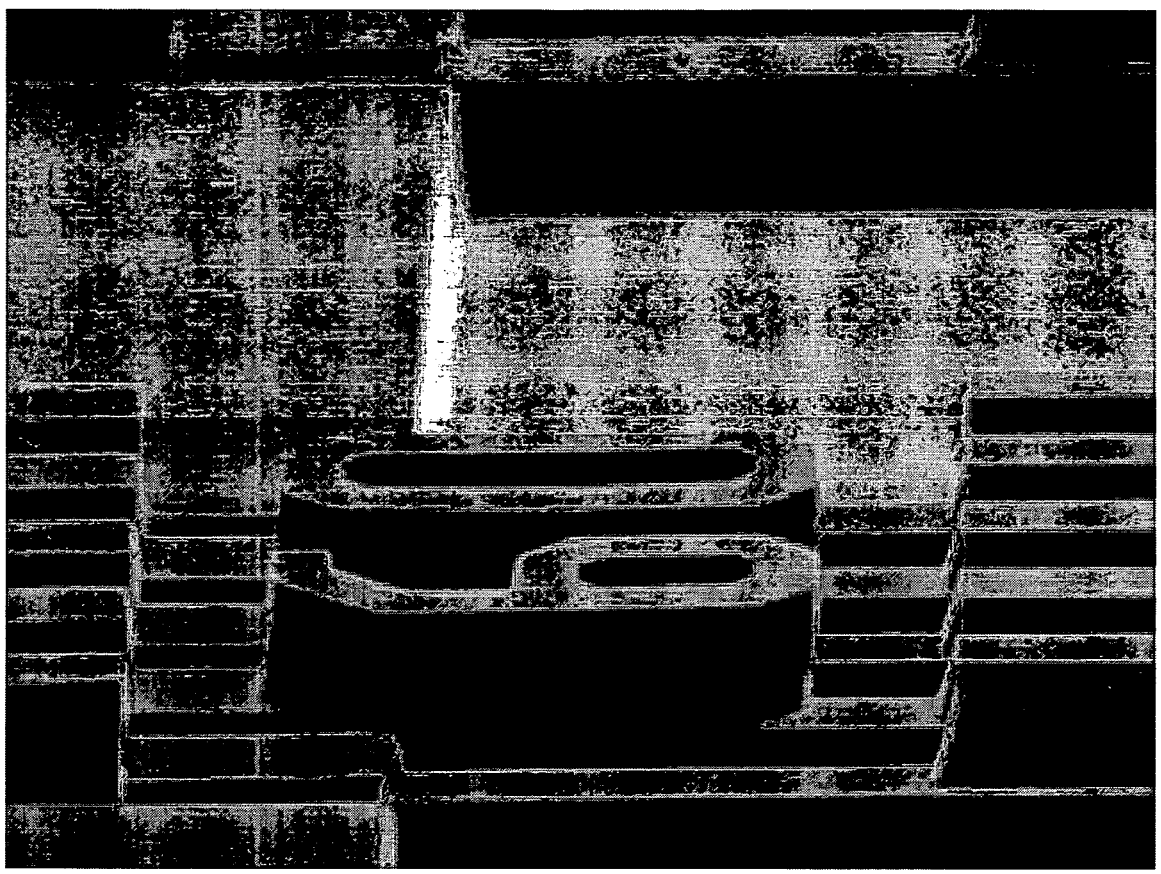
FIG. 1 is a perspective image of a multilayer resist pattern and substrate formed using multilayer resist pattern formation steps employed in a method of the present invention.

As follows is a description of embodiments of the present invention.

A method of forming a plated product of the present invention comprises the steps described below. Namely, (A) a step of forming a layer of a negative photoresist composition, and then heating and exposing the composition (hereafter referred to as step (A)), (B) a step of repeating the step (A) so that the step is performed a total of 2 or more times to superimpose layers of the negative photoresist, and then developing all of the layers simultaneously to form a multilayer resist pattern (hereafter referred to as step (B)), and (C) a step of conducting plating treatment within the multilayer resist pattern (hereafter referred to as step (C)).

A negative photoresist composition of the present invention comprises (a) an alkali-soluble resin, (b) an acid generator, and (c) other components. Suitable examples of the negative photoresist composition used in the present invention include the type of thick-film chemically amplified negative photoresist compositions disclosed in Japanese Unexamined Patent Application, First Publication No. 2003-114531. As follows is a description of each of the structural elements of a negative photoresist composition according to the present invention.

(a) Alkali-Soluble Resin

There are no particular restrictions on the alkali-soluble resin (hereafter referred to as the component (a)), which can use any of the alkali-soluble resins typically used as the base resin within conventional negative chemically amplified photoresists, and the resin is usually selected from known resins in accordance with the light source used for exposure. Novolak resins, acrylic resins, or resins in which the primary component is a copolymer containing hydroxystyrene structural units provide excellent characteristics such as resist shape and resolution, and are consequently widely used.

Novolak resins are particularly preferred as the component (a). By employing a novolak resin as the primary component, favorable stripping characteristics and excellent plating resistance can be achieved.

Novolak Resin

The novolak resin is obtained, for example, by an addition condensation of an aromatic compound with a phenolic hydroxyl group (hereafter, simply referred to as a phenol) and an aldehyde, in the presence of an acid catalyst.

Examples of the phenol used include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, phloroglucinol, hydroxydiphenyl, bisphenol A, gallic acid, gallic esters, α-naphthol, and β-naphthol.

Furthermore, examples of the aldehyde include formaldehyde, furfural, benzaldehyde, nitrobenzaldehyde, and acetaldehyde.

There are no particular restrictions on the catalyst used in the addition condensation reaction, and suitable acid catalysts include hydrochloric acid, nitric acid, sulfuric acid, formic acid, oxalic acid, and acetic acid.

Of these novolak resins, novolak resins formed from cresol, xylenol, and trimethylphenol are particularly preferred. m-cresol novolak resins produced by condensing m-cresol and an aldehyde display particularly favorable developing profiles, and are consequently particularly desirable.

The weight average molecular weight of the novolak resin is typically within a range from 3,000 to 50,000, and preferably from 5,000 to 30,000. If the weight average molecular weight is less than 3,000, then the thickness of the cured portions of the film tend to decrease (become thinner) on developing, whereas if the weight average molecular weight exceeds 50,000, undesirable residues tend to be left following developing.

Acrylic Resins

Acrylic resins used in the present invention comprise (a1) a structural unit derived from a polymerizable compound with an ether linkage, and (a2) a structural unit derived from a polymerizable compound containing a carboxyl group.

Examples of (a1) polymerizable compounds containing an ether linkage include (meth)acrylic acid derivatives containing both an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, and tetrahydrofurfuryl (meth)acrylate, and of these, 2-methoxyethyl (meth)acrylate and methoxytriethylene glycol (meth)acrylate are preferred. These compounds can be used either alone, or in combinations of two or more different compounds.

Examples of (a2) polymerizable compounds containing a carboxyl group include monocarboxylic acids such as acrylic acid, methacrylic acid, and crotonic acid, dicarboxylic acids such as maleic acid, fumaric acid, and itaconic acid, and compounds containing both a carboxyl group and an ester linkage such as 2-methacryloyloxyethylsuccinic acid, 2-methacryloyloxyethylmaleic acid, 2-methacryloyloxyethylphthalic acid, and 2-methacryloyloxyethylhexahydrophthalic acid. Of these, acrylic acid and methacrylic acid are preferred. These compounds can be used either alone, or in combinations of two or more different compounds.

The quantity within the acrylic resin of the structural unit (a1) derived from a polymerizable compound containing an ether linkage is preferably within a range from 30 to 90% by weight, and even more preferably from 40 to 80% by weight. If this quantity exceeds 90% by weight, then the co-solubility of the resin in the resin solvent tends to worsen, and it tends to become more difficult to achieve a uniform resist film during prebaking, whereas if the quantity is less than 30% by weight, cracks tend to develop during plating.

Furthermore, the quantity within the acrylic resin of the structural unit (a2) derived from a polymerizable compound containing a carboxyl group is preferably within a range from 2 to 50% by weight, and even more preferably from 5 to 40% by weight. If this quantity is less than 2% by weight, then the alkali solubility of the acrylic resin deteriorates, meaning satisfactory developability cannot be achieved. Moreover, the stripping characteristics also deteriorate, causing residual resist to remain on the substrate. If the quantity exceeds 50% by weight, then the residual film ratio following developing decreases, and the plating resistance tends to deteriorate.

Polymers Containing a Hydroxystyrene Structural Unit

Examples of polymers containing a hydroxystyrene structural unit include radical or ionic copolymers formed solely from hydroxystyrene structural units including hydroxystyrenes such as p-hydroxystyrene, or α-alkylhydroxystyrenes such as α-methylhydroxystyrene and α-ethylhydroxystyrene, as well as copolymers formed from hydroxystyrene structural units and other, different structural units. The proportion of hydroxystyrene structural units within such polymers or copolymers is preferably at least 1% by weight, and even more preferably within a range from 10 to 30% by weight. The reason for this requirement is that if the proportion of the hydroxystyrene structural unit is less than 10% by weight, then the developability and resolution tend to deteriorate.

The weight average molecular weight of the copolymer containing a hydroxystyrene structural unit is preferably no more than 5,000, and even more preferably within a range from 2,000 to 4,000. This is because if the weight average molecular weight exceeds 5,000, the resolution tends to deteriorate.

Examples of preferred monomers for forming the structural unit other than the hydroxystyrene structural unit include monomers in which the hydroxyl group of the hydroxystyrene structural unit has been substituted with another group, and monomers containing an α,β-unsaturated double bond.

As the above other group used to substitute the hydroxyl group of the hydroxystyrene structural unit, alkali dissolution inhibiting groups that do not dissociate under the action of acid are used. Examples of such alkali dissolution inhibiting groups that do not dissociate under the action of acid include substituted or unsubstituted benzenesulfonyloxy groups, substituted or unsubstituted naphthalenesulfonyloxy groups, substituted or unsubstituted benzenecarbonyloxy groups, and substituted or unsubstituted naphthalenecarbonyloxy groups. Specific examples of preferred substituted or unsubstituted benzenesulfonyloxy groups include benzenesulfonyloxy groups, chlorobenzenesulfonyloxy groups, methylbenzenesulfonyloxy groups, ethylbenzenesulfonyloxy groups, propylbenzenesulfonyloxy groups, methoxybenzenesulfonyloxy groups, ethoxybenzenesulfonyloxy groups, propoxybenzenesulfonyloxy groups, and acetoaminobenzenesulfonyloxy groups, whereas specific examples of preferred substituted or unsubstituted naphthalenesulfonyloxy groups include naphthalenesulfonyloxy groups, chloronaphthalenesulfonyloxy groups, methylnaphthalenesulfonyloxy groups, ethylnaphthalenesulfonyloxy groups, propylnaphthalenesulfonyloxy groups, methoxynaphthalenesulfonyloxy groups, ethoxynaphthalenesulfonyloxy groups, propoxynaphthalenesulfonyloxy groups, and acetoaminonaphthalenesulfonyloxy groups. Examples of substituted or unsubstituted benzenecarbonyloxy groups, and substituted or unsubstituted naphthalenecarbonyloxy groups include the above substituted or unsubstituted sulfonyloxy groups in which the sulfonyloxy groups have been substituted with carbonyloxy groups. Of the above groups, acetoaminobenzenesulfonyloxy groups and acetoaminonaphthalenesulfonyloxy groups are particularly preferred.

Furthermore, specific examples of monomers containing an α,β-unsaturated double bond include styrene-based monomers such as styrene, chlorostyrene, chloromethylstyrene, vinyltoluene, and α-methylstyrene, acrylate monomers such as methyl acrylate, methyl methacrylate, and phenyl methacrylate, as well as monomers such as vinyl acetate and vinyl benzoate, and of these monomers, styrene is preferred.

Of the various copolymers containing a hydroxystyrene structural unit, those copolymers formed from a hydroxystyrene and a styrene, such as poly(4-hydroxystyrenestyrene) copolymers and poly(4-hydroxystyrene-methylstyrene) copolymers, display high resolution and excellent heat resistance and are consequently preferred.

The resin or copolymer of the component (a) can be used either alone, or in mixtures of two or more different materials.

In those cases where the component (a) is a mixed resin comprising a novolak resin and/or an acrylic resin, and a copolymer containing a hydroxystyrene structural unit, then if the combined weight of the two constituents is deemed 100 parts by weight, the quantity of the novolak resin and/or acrylic resin is typically within a range from 50 to 98 parts by weight, and preferably from 55 to 95 parts by weight, and the quantity of the copolymer containing a hydroxystyrene structural unit is within a range from 50 to 2 parts by weight, and preferably from 45 to 5 parts by weight. Using this type of blend ratio improves both the developability and the resolution, and is consequently preferred.

The aforementioned component (a) typically accounts for 30 to 99 parts by weight, and preferably from 65 to 95 parts by weight, of each 100 parts by weight of the combined solid fraction of the components (a) through (c).

If the quantity of the component (a) is less than 50 parts by weight, then the plating resistance, the plating shape, and the stripping characteristics can deteriorate undesirably, whereas if the quantity exceeds 99 parts by weight, undesirable developing defects can occur during developing.

(b) Acid Generator

There are no particular restrictions on the acid generator (hereafter referred to as the component (b)) used in the present invention, provided it generates acid, either directly or indirectly, on irradiation with light. Specific examples of suitable acid generators include halogen-containing triazine compounds such as 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4- methylenedioxyphenyl)-4,6-bis(trichloromethyl)-1,3,5-triazine, tris(1,3-dibromopropyl)-1,3,5-triazine; and tris(2,3-dibromopropyl)-1,3,5-triazine, and halogen-containing isocyanurate compounds represented by a general formula shown below such as tris(2,3-dibromopropyl) isocyanurate.

[Chemical Formula 1]

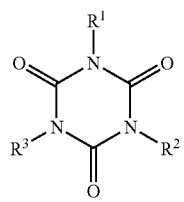

(wherein, $R^1$ to $R^3$ may be either the same or different, and each represents a halogenated alkyl group)

Other specific examples of the component (b) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, and compounds represented by a general formula shown below.

[Chemical Formula 2]

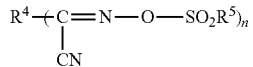

(wherein, $R^4$ represents a monovalent to trivalent organic group, $R^5$ represents a substituted or unsubstituted saturated hydrocarbon group, unsaturated hydrocarbon group, or aromatic compound group, and n represents a natural number within a range from 1 to 3. Here, the term "aromatic compound group" refers to a group formed from a compound that shows the characteristic physical and chemical properties of an aromatic compound, and specific examples include aromatic hydrocarbon groups such as a phenyl group or naphthyl group, and heterocyclic groups such as a furyl group or thienyl group. These groups may also include suitable substituents on the ring, including one or more halogen atoms, alkyl groups, alkoxy groups, or nitro groups. Furthermore, as the group $R^5$, alkyl groups of 1 to 4 carbon atoms are particularly preferred, including a methyl group, ethyl group, propyl group, and butyl group. Compounds in which $R^4$ represents an aromatic compound group, and $R^5$ represents a lower alkyl group are particularly preferred. Examples of the acid generators represented by the above general formula, in the case where n=1, include compounds in which $R^4$ is a phenyl group, a methylphenyl group or a methoxyphenyl group, and $R^5$ is a methyl group, namely, o-(methylsulfonyloxyimino)-1-phenylacetonitrile, α-(methylsulfonyloxyimino)-1-(p-methylphenyl)acetonitrile, and α-(methylsulfonyloxyimino)-1-(p-methoxyphenyl)acetonitrile. In the case where n=2, specific examples of the acid generators represented by the above general formula include the acid generators represented by the chemical formulas shown below.)

[Chemical Formulas 3]

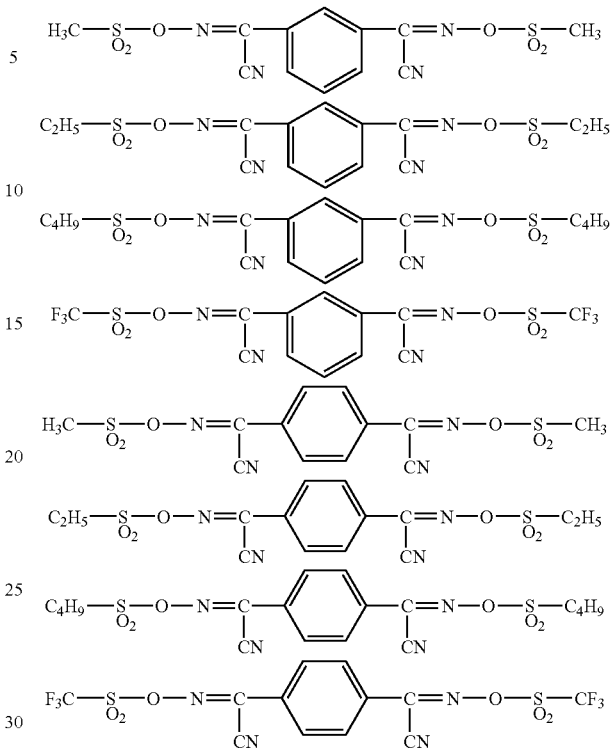

Additional specific examples of the component (b) include bissulfonyldiazomethanes such as bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane; nitrobenzyl derivatives such as 2-nitrobenzyl p-toluenesulfonate, 2,6-nitrobenzyl p-toluenesulfonate, nitrobenzyl tosylate, dinitrobenzyl tosylate, nitrobenzyl sulfonate, nitrobenzyl carbonate, and dinitrobenzyl carbonate; sulfonic acid esters such as pyrogallol trimesylate, pyrogallol tritosylate, benzyl tosylate, benzyl sulfonate, N-methylsulfonyloxysuccinimide, N-trichloromethylsulfonyloxysuccinimide, N-phenylsulfonyloxymaleimide, and N-methylsulfonyloxyphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzoin tosylates such as benzoin tosylate and α-methylbenzoin tosylate; and other diphenyliodonium salts, triphenylsulfonium salts, phenyldiazonium salts, and benzyl carbonate. Triazine compounds display particularly good performance as an acid generator under light irradiation, and also display favorable solubility in those cases where a solvent is used, and are consequently preferred. Of the triazine compounds, the use of bromo-containing triazine compounds, and particularly 2,4-bis-trichloromethyl-6-(3-bromo-4-methoxy)phenyl-s-triazine, 2,4-bis-trichloromethyl-6-(3-bromo-4-methoxy)styrylphenyl-s-triazine, and tris(2,3-dibromopropyl) isocyanurate, is ideal. The acid generator of the component (b) can use either a single compound, or a mixture of two or more different compounds.

The quantity of the component (b) is typically within a range from 0.01 to 5 parts by weight, and preferably from 0.05 to 2 parts by weight, and even more preferably from 0.1 to 1 part by weight, per 100 parts by weight of the combined solid fraction of the components (a) through (c). If the quantity of the component (b) is less than 0.01 parts by weight, then cross-linking curing does not proceed satisfactorily in the presence of heat and light, meaning the plating resistance, chemical resistance, and adhesion of the product coating film tend to deteriorate, and the shape of the plated product tends to be inferior. In contrast, if the quantity exceeds 5 parts by weight, then undesirable developing defects can occur during developing.

(c) Other Components

An example of the other components used in the present invention (hereafter referred to as the component (c)) is a cross-linking agent. As the cross-linking agent, an amino compound such as a melamine resin, urea resin, guanamine resin, glycoluril-formaldehyde resin, succinylamide-formaldehyde resin, or ethylene urea-formaldehyde resin can be used, although alkoxymethylated amino resins such as alkoxymethylated melamine resin or alkoxymethylated urea resin are particularly desirable. The above alkoxymethylated amino resins can be produced by reacting a boiling aqueous solution of melamine or urea with formalin to generate a condensation product, and then etherifying this condensation product with a lower alcohol such as methyl alcohol, ethyl alcohol, propyl alcohol, butyl alcohol, or isopropyl alcohol, and then cooling the reaction mixture to precipitate the product. Specific examples of these alkoxymethylated amino resins include methoxymethylated melamine resin, ethoxymethylated melamine resin, propoxymethylated melamine resin, butoxymethylated melamine resin, methoxymethylated urea resin, ethoxymethylated urea resin, propoxymethylated urea resin, and butoxymethylated urea resin. These alkoxymethylated amino resins can be used either alone, or in combinations of two or more different materials. Alkoxymethylated melamine resins are particularly preferred, as they display minimal variation in resist pattern dimensions with variations in the radiation exposure dose, enabling the formation of a stable resist pattern. Of these resins, methoxymethylated melamine resin, ethoxymethylated melamine resin, propoxymethylated melamine resin, and butoxymethylated melamine resin are ideal. The quantity used of the above cross-linking agent is typically within a range from 1 to 30 parts by weight, and preferably from 5 to 20 parts by weight, per 100 parts by weight of the combined solid fraction of the components (a) through (c). If the quantity of the component (c) is less than 1 part by weight, then the plating resistance, chemical resistance, and adhesion of the product coating film tend to deteriorate, and the shape of the plated product tends to be inferior. In contrast, if the quantity exceeds 30 parts by weight, then undesirable developing defects can occur during developing.

In addition, a negative photoresist composition of the present invention may also incorporate a suitable quantity of an organic solvent in order to regulate the viscosity. Specific examples of suitable solvents include ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol dipropyl ether, propylene glycol monomethyl ether, propylene glycol monoethyl ether, propylene glycol monopropyl ether, propylene glycol monobutyl ether, propylene glycol dimethyl ether, propylene glycol diethyl ether, diethylene glycol monomethyl ether, diethylene glycol monoethyl ether, diethylene glycol monophenyl ether, diethylene glycol dimethyl ether, diethylene glycol diethyl ether, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, acetone, methyl ethyl ketone, diethyl ketone, methyl isobutyl ketone, ethyl isobutyl ketone, tetrahydrofuran, cyclohexanone, methyl propionate, ethyl propionate, propyl propionate, isopropyl propionate, methyl 2-hydroxypropionate, ethyl 2-hydroxypropionate, ethyl 2-hydroxy-2-methylpropionate, methyl-3-methoxypropionate, ethyl-3-methoxypropionate, ethyl-3-ethoxypropionate, ethyl-3-propoxypropionate, propyl-3-methoxypropionate, isopropyl-3-methoxypropionate, ethyl ethoxyacetate, ethyl oxyacetate, methyl 2-hydroxy-3-methylbutanoate, methyl acetate, ethyl acetate, propyl acetate, isopropyl acetate, butyl acetate, isoamyl acetate, methyl carbonate, ethyl carbonate, propyl carbonate, butyl carbonate, methyl pyruvate, ethyl pyruvate, propyl pyruvate, butyl pyruvate, methyl acetoacetate, ethyl acetoacetate, benzyl methyl ether, benzyl ethyl ether, dihexyl ether, benzyl acetate, ethyl benzoate, diethyl oxalate, diethyl maleate, γ-butyrolactone, benzene, toluene, xylene, cyclohexanone, methanol, ethanol, propanol, butanol, hexanol, cyclohexanol, ethylene glycol, diethylene glycol, and glycerol. These solvents can be used alone or in mixtures of two or more solvents. In order to enable the formation of coating films with a thickness of at least 20 μm by spin coating of the resulting negative photoresist composition, the quantity of the solvent is preferably sufficient to produce a solid fraction concentration of no more than 65% by weight. If the solid fraction concentration exceeds 65% by weight, then the fluidity of the composition deteriorates markedly, making handling difficult, and making it difficult to obtain uniform resist films by spin coating.

Where necessary, the composition of the present invention may further comprise quenchers such as triethylamine, tributylamine, dibutylamine, triethanolamine, and other secondary or tertiary amines, in addition to the components described above.

A surfactant can also be blended into a composition of the present invention to improve properties such as the coating, defoaming, and leveling properties. Examples of suitable surfactants include anionic, cationic, and non-ionic surfactants. Specific examples include fluorine-containing surfactants available commercially under the brand names of BM-1000 and BM-1100 (manufactured by BM Chemie GmbH), Megafac F142D, Megafac F172, Megafac F173 and Megafac F183 (manufactured by Dainippon Ink & Chemicals, Incorporated), Fluorad FC-135, Fluorad FC-170C, Fluorad FC-430 and Fluorad FC-431 (manufactured by Sumitomo 3M Limited), Surfron S-112, Surfron S-113, Surfron S-131, Surfron S-141 and Surfron S-145 (manufactured by Asahi Glass Co., Ltd.), and SH-28PA, SH-190, SH-193, SZ-6032 and SF-8428 (manufactured by Toray Silicone Co., Ltd.). The quantity used of these surfactants is preferably no more than 5 parts by weight per 100 parts by weight of the alkali-soluble resin (a).

The composition of the present invention can also use an adhesion assistant to improve adhesion with the substrate. As the adhesion assistant, functional silane coupling agents are particularly effective. The term "functional silane coupling agents" as used herein refers to silane coupling agents each having a reactive substituent such as a carboxyl group, methacryloyl group, isocyanate group or epoxy group. Specific examples include trimethoxysilylbenzoic acid, γ-methacryloyloxypropyltrimethoxysilane, vinyltriacetoxysilane, vinyltrimethoxysilane, γ-glycidoxypropyltrimethoxysilane, and β-(3,4-epoxycyclohexyl)ethyltrimethoxysilane. The blend quantity of the adhesion assistant is preferably no more than 20 parts by weight per 100 parts by weight of the alkali-soluble resin (a).

In order to finely adjust the solubility within an alkali developing solution, the composition of the present invention may also comprise an added monocarboxylic acid such as acetic acid, propionic acid, n-butyric acid, iso-butyric acid, n-valeric acid, iso-valeric acid, benzoic acid, and cinnamic acid; hydroxymonocarboxylic acid such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; a polycarboxylic acid such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid, and 1,2,5,8-napthalenetetracarboxylic acid; or acid anhydride such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bisanhydrotrimellitate, and glycerol trisanhydrotrimellitate. In addition, the composition may also comprise an added high boiling solvent such as N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate. The quantity used of this compound that is added to finely adjust the solubility of the composition within an alkali developing solution can be set in accordance with factors such as the intended usage and the coating method employed, and although there are no particular restrictions on the quantity provided the mixture can be mixed to generate a uniform composition, the quantity typically accounts for no more than 60% by weight, and preferably no more than 40% by weight, of the product composition, In addition, other additives such as fillers, coloring agents, and viscosity regulators can also be added to the composition of the present invention as required. Examples of suitable fillers include silica, alumina, talc, bentonite, zirconium silicate, and powdered glass. Examples of suitable coloring agents include extender pigments such as alumina white, clay, barium carbonate and barium sulfate; inorganic pigments such as zinc white, white lead, chrome yellow, red lead, ultramarine blue, iron blue, titanium oxide, zinc chromate, red iron oxide and carbon black; organic pigments such as brilliant carmine 6B, permanent red 6B, permanent red R, benzidine yellow, phthalocyanine blue and phthalocyanine green; basic dyes such as magenta and rhodamine; direct dyes such as direct scarlet and direct orange; and acid dyes such as rhocerin and metanil yellow. Furthermore, examples of suitable viscosity regulators include bentonite, silica gel, and aluminum powder. These additives can be added in quantities that do not impair the essential characteristics of the composition, and preferably account for no more than 50% by weight of the product composition.

Furthermore, antifoaming agents and other additives can also be added to a composition of the present invention where necessary. Examples of the antifoaming agent include silicone-based and fluorine-based antifoaming agents. The other components of the above component (c) can be used either alone, or in mixtures of two or more different materials.

The quantity of the component (c) is typically at least 1 part by weight, and preferably at least 5 parts by weight, and typically no more than 50 parts by weight, and preferably no more than 30 parts by weight, per 100 parts by weight of the combined solid fraction of the components (a) through (c). If the quantity of the component (c) is less than 1 part by weight, then the product coating film may not display satisfactory performance.

The composition of the present invention may be prepared by simply mixing and stirring the components together using conventional methods, if the composition contains no added fillers or pigments. If the composition contains an added filler or pigment, then the components may be dispersed and mixed by using a dispersion device such as a dissolver, a homogenizer, or a three-roll mill. Furthermore, if required the composition may also be filtered using a mesh or a membrane filter.

A composition of the present invention is used in a method of forming a plated product described below. When a composition of the present invention is used to form a negative photoresist film, the film thickness of a single layer is typically within a range from 10 to 2000 μm, and preferably from 20 to 1000 μm, and even more preferably from 50 to 500 μm.

Sheet-like Negative Photoresist Composition

A sheet-like negative photoresist composition according to the present invention is produced by applying a negative photoresist composition of the present invention to the surface of a releasable support film, and drying the applied coating to form a negative photoresist film. A sheet-like negative photoresist composition of the present invention can be used in the aforementioned step (A) for forming a layer of a negative photoresist composition. The sheet-like negative photoresist composition of the present invention is protected by a releasable film that can be easily removed from the surface of the negative photoresist film, is easily stored, transported and handled, displays a high level of film planarity, and facilitates the formation of a coating film on a substrate.

There are no particular restrictions on the support film used in the production of a sheet-like negative photoresist composition of the present invention, and any releasable film which enables ready removal of layers coated onto the support film, and enables transfer of such layers to a glass substrate can be used. Suitable examples include thermoplastic resin flexible films formed from synthetic resin films with a film thickness of 15 to 125 μm, including polyethylene terephthalate, polyethylene, polypropylene, polycarbonate and polyvinyl chloride. Where necessary, the support film may be subjected to release treatment to further facilitate film transfer.

In order to form a negative photoresist film on a support film, a negative photoresist composition of the present invention is prepared, and then applied to the surface of the support film using an applicator, bar coater, wire bar coater, roll coater, or curtain flow coater or the like. Roll coaters produce particularly superior levels of film thickness uniformity, and also enable the efficient formation of thick films, and are consequently preferred.

Following drying of the applied coating, in order to stably protect the negative photoresist film prior to use, a protective film is preferably adhered to the surface of the negative photoresist film. Suitable examples of this protective film include polyethylene terephthalate film, polypropylene film or polyethylene film of thickness 15 to 125 µM comprising a layer of coated or baked silicone.

A method of forming a plated product of the present invention is conducted in the manner described below.

(A) Step of Forming a Layer of a Negative Photoresist Composition, Heating and Exposing the Composition, and then Conducting Further Heating as Required A solution of a negative photoresist composition prepared in the manner described above is applied to the surface of a substrate or resist layer with a thickness as described above, and is then heated to remove the solvent and form the desired negative resist layer (negative photoresist film). As the substrate, a conventional substrate can be used. Suitable examples of the substrate include substrates of silicon, gold, copper, nickel, and palladium, as well as substrates in which a layer of one of these metals has been formed on a substrate of a different material. As the method of applying the composition to the substrate or resist layer, spin coating, slit coating, roll coating, screen printing, or applicator methods can be employed.

The heating conditions employed for the applied coating of the composition of the present invention vary depending on factors such as the nature of the components within the composition, the blend ratios, and the thickness of the coating, but typically involve a temperature within a range from 70 to 140° C., and preferably from 80 to 120° C., for a period of 2 to 60 minutes. As the heating method, either a hot plate method or an oven-based method can be used, although oven-based methods are preferred as they allow heating from both above and below, enabling a more effective application of heat.

Furthermore, in those cases where an aforementioned sheet-like negative photoresist composition is used, the protective film is first removed from the sheet-like negative photoresist, the exposed negative photoresist film is overlayed on top of the substrate or resist layer, and is then bonded or pressure bonded from the support film side using known methods. For example, movement of a heated roller can be used to effect thermocompression bonding of the negative photoresist film to the surface of the substrate. Subsequently, the support film is removed, thereby exposing the negative photoresist film surface, and completing formation of the negative photoresist layer. In those cases where the support film is transparent relative to the exposure light, the exposure treatment can be conducted prior to removal of the support film. Thermocompression bonding typically involves heating the surface of the substrate to a temperature of 80 to 140° C., and then using a roll pressure of 1 to 5 kg/cm$^2$ and a movement speed of 0.1 to 10.0 m/minute. The substrate may also be preheated if desired, and the preheat temperature is typically selected within a range from 40 to 100° C.

The coating film is then irradiated with radiation such as ultraviolet light of wavelength 300 to 500 nm or visible light, either across the entire film surface, or through a mask with a predetermined pattern, thereby exposing either the entire surface of the film, or only those pattern portions required for forming the plated product. As the light source for the radiation, a low pressure mercury lamp, high pressure mercury lamp, ultra high pressure mercury lamp, metal halide lamp, or argon gas laser or the like can be used. In this description, the term "radiation" refers to ultraviolet radiation, visible light, far ultraviolet radiation, X-rays, and electron beams and the like. The radiation exposure dose varies depending on the nature of each of the components within the composition, the blend proportions used, and the thickness of the coating film, although in those cases where an ultra high pressure mercury lamp is used, a typical exposure dose is within a range from 100 to 3,000 mJ/cm$^2$.

Furthermore, following exposure, further heating (post exposure baking) can be conducted using one of the above methods where necessary. Oven-based heating is preferred as it allows heating from both above and below, enabling a more effective application of heat to the resist layer.

(B) Step of Repeating the Step (A) and Performing the Step a Total of 2 or More Times to Superimpose Layers of the Negative Photoresist, and then Developing All of the Layers Simultaneously to Form a Multilayer Resist Pattern The step (A) is performed at least twice to superimpose layers of the negative photoresist. By heating the negative photoresist composition following layer formation, the exposed surface of the resist layer is hardened, enabling additional resist layers to be superimposed thereon without distorting the underlying layer. The resulting multilayer resist has at least 2 layers, and preferably from 2 to 20 layers, and even more preferably from 2 to 10 layers. The combined film thickness of the superimposed resist layers is typically 20 µm or greater, and is preferably within a range from 40 to 1,000 µm.

In the present invention, the exposure conducted in the aforementioned step (A) is preferably a pattern formation exposure treatment conducted throughout all of the resist layers. This enables the production of a multilayer negative resist composition that incorporates no entirely exposed layers.

Structures in which the surface area exposed during the exposure performed in the step (A) is greater for those layers positioned farther from the exposure light source than for those layers positioned closer to the light source are particularly preferred. This enables improved stability of the pattern shape of the multilayer resist pattern, thus facilitating the subsequent plating.

Furthermore, structures in which the pattern shape is different for each resist pattern layer are also possible. This means that three dimensional shapes in which the shape varies through the film thickness direction, such as gears of differing diameter, can be formed as a plated product.

All of the resist layers of the thus obtained superimposed multilayer negative resist composition are developed simultaneously using a conventional method. This post irradiation developing method involves using an aqueous alkali solution as the developing solution, and dissolving and removing the unnecessary non-irradiated portions. Suitable examples of the developing solution include aqueous solutions of alkali materials such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene, and 1,5-diazabicyclo[4,3,0]-5-nonane. An aqueous solution prepared by adding a suitable quantity of a water-soluble organic solvent such as methanol or ethanol, or a surfactant to the aqueous solution of any of these alkali compounds may also be used as the developing solution.

The developing time varies depending on the nature of each of the components within the composition, the blend proportions used, and the dried film thickness of the composition, but is typically within a range from 1 to 30 minutes. Furthermore, suitable methods for the developing process include spin methods, dipping methods, puddle methods, and spray developing methods. Following developing, the structure is washed under running water for 30 to 90 seconds, and is then dried using an air gun or an oven or the like.

(C) Step of Conducting Plating Treatment within the Multilayer Resist Pattern

There are no particular restrictions on the plating method, and any conventional plating method can be used. For example, as the method for conducting plating within the removed portions of the resist, either electroplating or electroless plating can be selected according to need. Furthermore, as the plating metal, gold, copper, solder or nickel or the like can be selected according to need. This plating treatment leads to the formation of a plated product.

Following formation of the plated product, the multilayer resist pattern can be removed using conventional removal methods. Suitable removal methods include resist incineration and washing methods, and methods in which the resist pattern is brought into contact with (immersed in) a conventional stripping solution composition. Methods employing a stripping solution composition are preferred in terms of ease of use, and restricting damage to the plated product. Moreover, multilayer resist patterns of the present invention display favorable stripping characteristics in stripping solutions. Specific examples of the removal method employed when using a stripping solution composition on the multilayer resist pattern include dipping, immersion, and shower methods. Ultrasound agitation can also be used during stripping. Once the resist pattern has been removed from the substrate, the substrate is washed using conventional methods, and is then dried.

The above steps enable the formation of a shaped plated product with multiple levels, with a height above the substrate of at least 20 μm. The method can even be used in the formation of multiple level plated products or variable diameter plated products with depths of 100 μm or greater, which have been unattainable with conventional methods, making the method very useful in the production of ultra small electronic devices or microscopic components typified by MEMS.

EXAMPLES

As follows is a description of examples of the present invention, although these are presented merely to facilitate the description of the present invention, and are not to be considered as limiting. Unless specified otherwise, "parts" refers to parts by weight, and % values refer to weight % values.

Synthesis Example 1

Formalin was added to m-cresol, and a condensation was then conducted under conventional conditions using oxalic acid as a catalyst, thus yielding a meta-cresol novolak resin. This resin was subjected to fractionation to remove the low molecular weight fraction, yielding a novolak resin with a weight average molecular weight of 6,000.

Synthesis Example 2

35 parts by weight of dicyclopentanyl methacrylate, 10 parts by weight of methacrylic acid, 25 parts by weight of 2-hydroxyethyl methacrylate, 25 parts by weight of styrene, and 5 parts by weight of 1,3-butadiene were subjected to radical polymerization using a conventional method, yielding an acrylic resin. This resin was subjected to fractionation, yielding an acrylic resin with a weight average molecular weight of 20,000.

Example 1

The various components shown in the Table below (units are parts by weight) were mixed together to yield a chemically amplified negative photoresist composition. A gold substrate was used as the substrate to which the resist was applied.

Step (A): this negative photoresist composition was applied to the top surface of the substrate in sufficient quantity to generate a dried film thickness of 100 μM, and the applied coating was heated for 10 minutes in an oven at 120° C. Subsequently, an exposure apparatus (brand name: Canon PLA501F Hardcontact, manufactured by Canon Inc.) was used to expose the resist film in a test pattern using an exposure of 2000 mJ/cm$^2$, and the exposed resist was then subjected to further heat treatment (post exposure baking) for 10 minutes in an oven at 120° C.

Step (B): the step (A) was repeated to superimpose another resist layer, and the structure was then developed for 15 minutes in a developing solution (brand name: P-7G from the PMER series of developing solutions, manufactured by Tokyo Ohka Kogyo Co., Ltd.), thus forming a multilayer resist pattern. The shape of the thus obtained multilayer resist pattern was confirmed under a SEM (scanning electron microscope).

Step (C): subsequently, using a 1 liter plating solution comprising 340 g of nickel sulfamate, 40 g of nickel chloride, 40 g of boric acid, and 22 ml of an additive (brand name: Lectronic 10-03S, manufactured by Japan Electroplating Engineers Co., Ltd.), Ni electroplating was conducted under conditions including a current density of 2 A/dm$^2$, 50° C., and a plating time of 9 hours. Stripping was then conducted for 1 hour at 80° C. in a stripping solution (Stripper 710, manufactured by Tokyo Ohka Kogyo Co., Ltd.), thus forming a plated product. The shape of the thus formed plated product, and the existence of any resist stripping residues were confirmed under a SEM (scanning electron microscope).

Example 2

With the exceptions of repeating the step (A) twice in the step (B) (a total of three repetitions), and altering the treatment times to 50 minutes for the developing, 15 hours for the plating, and 1 hour 30 minutes for the stripping, a plated product was formed in the same manner as the example 1.

Example 3

With the exceptions of repeating the step (A) three times in the step (B) (a total of four repetitions), and altering the treatment times to 90 minutes for the developing, 18 hours for the plating, and 2 hours for the stripping, a plated product was formed in the same manner as the example 1.

Example 4

With the exceptions of applying the resist composition in sufficient quantity to generate a dried film thickness of 50 μm, heat treating the applied coating for 10 minutes at 120° C., exposing the resist film in a pattern using an exposure of 1000 mJ/cm², subjecting the resist to further heat treatment (post exposure baking) for 10 minutes at 120° C. in the step (A), and then conducting developing for 10 minutes, plating for 4 hours 30 minutes, and stripping for 30 minutes, a plated product was formed in the same manner as the example 1.

Example 5

With the exceptions of applying the resist composition in sufficient quantity to generate a dried film thickness of 150 μm in the step (A), heat treating the applied coating for 10 minutes at 120° C., exposing the resist film in a pattern using an exposure of 3000 mJ/cm², subjecting the resist to further heat treatment (post exposure baking) for 10 minutes at 120° C., and then conducting developing for 50 minutes, plating for 15 hours, and stripping for 1 hour 30 minutes, a plated product was formed in the same manner as the example 1.

Comparative Example 1

With the exceptions of using a chemically amplified negative photoresist composition prepared by mixing 100 parts by weight of an alkali-insoluble epoxy resin (brand name: Epikote 157S70, manufactured by Japan Epoxy Resins Co., Ltd.), 3 parts by weight of an acid generator (brand name: Adeka Optomer SP-170, manufactured by Asahi Denka Co., Ltd.), and 50 parts by weight of γ-butyrolactone as a solvent, and using propylene glycol monomethyl ether acetate as the developing solution, a plated product was formed in the same manner as the example 1. Following formation of the plated product, an attempt was made to conduct stripping in a similar manner to above, but the resist could not be stripped.

In this example, the use of an alkali-insoluble resin meant a favorable result could not be obtained.

Comparative Example 2

The same chemically amplified negative photoresist composition as that used in the example 1 was used, and a gold substrate was used as the substrate to which the resist was applied.

Step (A): this negative photoresist composition was applied to the top surface of the substrate in sufficient quantity to generate a dried film thickness of 100 μm, and the applied coating was heated for 10 minutes in an oven at 120° C. Subsequently, an exposure apparatus (brand name: Canon PLA501F Hardcontact, manufactured by Canon Inc.) was used to expose the resist film in a test pattern using an exposure of 2000 mJ/cm², and the exposed resist was then subjected to further heat treatment (post exposure baking) for 10 minutes in an oven at 120° C. The resist was then developed for 10 minutes in a developing solution (brand name: P-7G from the PMER series of developing solutions, manufactured by Tokyo Ohka Kogyo Co., Ltd.), thus forming a resist pattern.

Step (B): the step (A) was repeated to superimpose another resist layer, thus forming a multilayer resist pattern. The shape of the thus obtained multilayer resist pattern was confirmed under a SEM (scanning electron microscope).

Step (C): a plated product was formed in the same manner as the example 1. The shape of the thus formed plated product, and the existence of any resist stripping residues were confirmed under a SEM (scanning electron microscope). The thus formed multilayer resist pattern displayed poor film planarity and unsatisfactory resolution, and a satisfactory plated product could not be formed.

In this example, because the layers were not all developed simultaneously, but were developed one layer at a time, a favorable result could not be obtained.

Comparative Example 3

With the exception of using a photopolymerizable negative photoresist composition comprising a mixture of 100 parts by weight of the acrylic resin of the synthesis example 2, 8 parts by weight of 2,2-dimethoxy-1,2-diphenylethan-1-one and 4 parts by weight of 2-(o-chlorophenyl)-4,5-diphenylimidazole dimer as photopolymerization initiators, as well as 30 parts by weight of ethylene oxide-modified trimethylolpropane triacrylate (brand name: Aronix M-350, manufactured by Toagosei Co., Ltd.), 10 parts by weight of polyethylene glycol diacrylate (brand name: NK ester A-200, manufactured by Shin-Nakamura Chemical Co., Ltd.), 10 parts by weight of N-vinylpyrrolidone (brand name: Aronix M-150, manufactured by Toagosei Co., Ltd.), 0.1 parts by weight of methylhydroquinone, 50 parts by weight of propylene glycol monomethyl ether acetate (PGMEA), and 50 parts by weight of methyl isobutyl ketone as the negative photoresist composition, a plated product was formed in the same manner as the example 1. The resolution of the resulting multilayer resist pattern was unsatisfactory, and the shape of the formed plated product was also poor.

In this example, because a photopolymerizable negative photoresist composition was used, a favorable result could not be obtained.

TABLE 1

(Unless otherwise listed, numbers refer to parts by weight)

| | Component [*1] | Example | | | | | Comparative Example | | |
|---|---|---|---|---|---|---|---|---|---|
| | | 1 | 2 | 3 | 4 | 5 | 1 [*2] | 2 | 3 [*3] |
| Resin | (a-1) | 90 | 90 | 90 | 90 | 90 | — | 90 | — |
| Acid generator | (b-1) | 0.5 | 0.5 | 0.5 | 0.5 | 0.5 | — | 0.5 | — |
| Cross-linking agent | (c-1) | 10 | 10 | 10 | 10 | 10 | — | 10 | — |
| Other components | (d-1) | 150 | 150 | 150 | 150 | 150 | — | 150 | — |
| | (d-2) | 10 | 10 | 10 | 10 | 10 | — | 10 | — |
| Film thickness of each resist layer | | 100 | 100 | 100 | 50 | 150 | 100 | 100 | 100 |
| Number of superimposed levels within multilayer resist | | 2 | 3 | 4 | 2 | 2 | 2 | 2 | 2 |
| Film planarity of second layer onwards | | A | A | A | A | A | A | C | A |

TABLE 1-continued (Unless otherwise listed, numbers refer to parts by weight)

| Component *1 | Example | | | | | Comparative Example | | |
|---|---|---|---|---|---|---|---|---|
| | 1 | 2 | 3 | 4 | 5 | 1 *2 | 2 | 3 *3 |
| Resolution | A | A | A | A | A | A | C | B |
| Plating Shape | A | A | A | A | A | A | — | C |
| Stripping characteristics | A | A | A | A | A | C | A | A |

Note *1:
(a-1): Alkali-soluble resin: the novolak resin of the synthesis example 1 (Mw = 6,000)
(b-1): Acid generator represented by the formula shown below
[Chemical Formula 4]

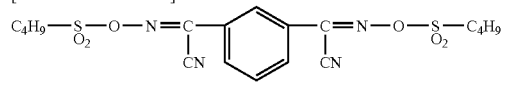

(c-1): Cross-linking agent: hexamethoxymethylated melamine
(brand name: Nikalac MW-100, manufactured by
Sanwa Chemical Co., Ltd.)
(d-1): Solvent: propylene glycol monomethyl ether acetate
(d-2): Monomer: hydroxystyrene monomer (Mw = 2,500)
(brand name: VP-2500, manufactured by Nippon Soda Co., Ltd.)
Note *2:
The blend components of the comparative example 1 are listed in the detailed description of the comparative example 1.
Note *3:
The blend components of the comparative example 3 are listed in the detailed description of the comparative example 3.

Evaluations

The film planarity, resolution, plating shape, and stripping characteristics of the multilayer resist pattern were evaluated using the following criteria. The results are shown in Table 1.

For the resolution evaluation, a variety of line and space patterns of different sizes (within a range from 20 to 80 μm, and a depth of 20 μm) were formed and evaluated. Film planarity of second layer onwards:

A: film thickness error is within ±10%
B: film thickness error exceeds ±10% but is within ±20%
C: film thickness error exceeds ±20%

Resolution

A: following step (B), a 40 μm line and space pattern is resolved at all layers
B: following step (B), a 60 μm line and space pattern is resolved at all layers
C: at least one layer is not resolvable Plating Shape:

A: the contact angle between the interface of each layer and the plating composition is within 90°±15°
C: the contact angle between the interface of each layer and the plating composition does not fall within 90°±15°

Stripping characteristics:

A: the resist is able to be stripped
B: some stripping residues remain
C: stripping is impossible These results show that a method of forming a plated product of the present invention enables the formation of a multilayer resist pattern with excellent resolution and stripping characteristics, and the shape of the resulting plated product is also excellent.

INDUSTRIAL APPLICABILITY

As described above, a method of forming a multiple level plated product using a negative photoresist composition according to the present invention, and a photosensitive composition used therein are very useful in the formation of thick-film plated products with multiple level shapes, and are particularly useful in the production of plated products used in ultra small electronic devices or microscopic components typified by MEMS.

The invention claimed is:

1. A method of forming a plated product, comprising:
(A) forming a first layer of a negative photoresist composition on a substrate, heating said first layer and then exposing said first layer to irradiation;
(B) forming a second layer of a negative photoresist composition on the first layer, heating said second layer and then exposing said second layer to irradiation to superimpose the second layer and the first layer of said negative photoresist;
(C) developing each of the layers simultaneously to form a multilayer resist pattern by dissolving and removing non-irradiated portions of both said first layer and said second layer; and
(D) conducting plating treatment within said multilayer resist pattern, wherein said negative photoresist composition comprises (a) an alkali-soluble resin, (b) an acid generator, and (c) other components.

2. A method of forming a plated product according to claim 1, wherein said exposures are exposures for pattern formation in all of said resist layers.

3. A method of forming a plated product according to claim 1, wherein exposure surface areas of said exposures are larger for a layer more distant from an exposure light source than for a layer closer to said exposure light source.

4. A method of forming a plated product according to claim 1, wherein each of said heatings following resist layer formation uses heat treatment within an oven.

5. A method of forming a plated product according to claim 1, wherein said component (a) is a novolak resin.

6. A method of forming a plated product according to claim 1, wherein said substrate is a conductive substrate.

7. A method of forming a plated product according to claim 1, wherein a pattern shape is different in each resist pattern layer.

8. A method of forming a plated product according to claim 1, wherein a pattern shape is the same in each resist pattern layer.

9. A method of forming a plated product according to claim 1, further comprising forming a third layer of a negative photoresist composition on the second layer, heating said third layer and then exposing said third layer to irradiation to superimpose the third layer, the second layer, and the first layer of said negative photoresist, whereby latent images are formed in all of said first, second and third layers.

10. A method of forming a plated product according to claim 9, further comprising forming one or more additional layers of a negative photoresist composition on the previous layer, heating each of said additional layers and then exposing each of said additional layers to irradiation to superimpose the additional layers, the third layer, the second layer, and the first layer of said negative photoresist, whereby latent images are formed in all of said layers.

11. A method of forming a plated product according to claim 1, further comprising heating any one of said layers, after exposing the layer to irradiation.

12. A method of forming a plated product according to claim 9, further comprising heating the third layer after exposing said third layer to irradiation.

13. A method of forming a plated product according to claim 10, further comprising heating each of said additional layers after exposing said additional layers to irradiation.

14. A method of forming a plated product, comprising:
(A) forming a first layer of a negative photoresist composition on a substrate by applying a negative photoresist composition sheet to the substrate, exposing said first layer to irradiation;
(B) forming a second layer of a negative photoresist composition on the first layer by applying a negative photoresist composition sheet to the first layer, exposing said second layer to irradiation to superimpose the second layer and the first layer of said negative photoresist;
(C) developing each of the layers simultaneously to form a multilayer resist pattern by dissolving and removing non-irradiated portions of both said first layer and said second layer; and
(D) conducting plating treatment within said multilayer resist pattern, wherein said negative photoresist composition comprises (a) an alkali-soluble resin, (b) an acid generator, and (c) other components.

15. A method of forming a plated product according to claim 14, wherein said substrate is a conductive substrate.

16. A method of forming a plated product according to claim 14, further comprising forming a third layer of a negative photoresist composition on the second layer by applying a negative photoresist composition sheet to the second layer, exposing said third layer to irradiation to superimpose the third layer, the second layer, and the first layer of said negative photoresist, whereby latent images are formed in all of said first, second and third layers.

17. A method of forming a plated product according to claim 16, further comprising forming one or more additional layers of a negative photoresist composition on the previous layer by applying a negative photoresist composition sheet to the previous layer, exposing each of said additional layers to irradiation to superimpose the additional layers, the third layer, the second layer, and the first layer of said negative photoresist, whereby latent images are formed in all of said layers.

18. A method of forming a plated product according to claim 14, further comprising heating any one of said layers, after exposing the layer to irradiation.

19. A method of forming a plated product according to claim 16, further comprising heating the third layer after exposing said third layer to irradiation.

20. A method of forming a plated product according to claim 17, further comprising heating each of said additional layers after exposing said additional layers to irradiation.

* * * * *

UNITED STATES PATENT AND TRADEMARK OFFICE
CERTIFICATE OF CORRECTION

PATENT NO.       : 8,105,763 B2
APPLICATION NO.  : 11/629017
DATED            : January 31, 2012
INVENTOR(S)      : Yasuo Masuda, Yasushi Washio and Koji Saito It is certified that error appears in the above-identified patent and that said Letters Patent is hereby corrected as shown below:

At Column 6, Line 8, Change "hydroxystyrenestyrene)" to --hydroxystyrene-styrene)--.

At Column 7, Line 20, After "group)" insert --.--.

At Column 7, Line 61, Change "o-(" to --α-(--.

At Column 11, Line 31, Change "napthalenetetracarboxylic" to --naphthalenetetracarboxylic--.

At Column 11, Line 57, Change "composition," to --composition.--.

At Column 13, Line 11, Change "μM" to --μm--.

At Column 16, Line 17 (Approx.), Change "μM," to --μm,--.

Signed and Sealed this
Fifth Day of June, 2012

David J. Kappos
*Director of the United States Patent and Trademark Office*